United States Patent
Vetury et al.

(10) Patent No.: US 9,124,221 B2
(45) Date of Patent: Sep. 1, 2015

(54) WIDE BANDWIDTH RADIO FREQUENCY AMPLIER HAVING DUAL GATE TRANSISTORS

(71) Applicant: RF Micro Devices, Inc., Greensboro, NC (US)

(72) Inventors: Ramakrishna Vetury, Charlotte, NC (US); Jeffrey Blanton Shealy, Cornelius, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 33 days.

(21) Appl. No.: 13/942,998

(22) Filed: Jul. 16, 2013

(65) Prior Publication Data

US 2014/0015609 A1   Jan. 16, 2014

Related U.S. Application Data

(60) Provisional application No. 61/672,060, filed on Jul. 16, 2012.

(51) Int. Cl.
| | | |
|---|---|---|
| *H03F 3/193* | (2006.01) | |
| *H03F 1/22* | (2006.01) | |
| *H03F 3/26* | (2006.01) | |

(52) U.S. Cl.
CPC ............... *H03F 3/193* (2013.01); *H03F 1/226* (2013.01); *H03F 3/265* (2013.01); *H03F 2200/06* (2013.01); *H03F 2200/09* (2013.01); *H03F 2200/534* (2013.01); *H03F 2200/541* (2013.01); *H03F 2200/63* (2013.01)

(58) Field of Classification Search
USPC .......................... 330/295, 124 R, 84, 286, 53
See application file for complete search history.

(56) References Cited

U.S. PATENT DOCUMENTS

| | | | |
|---|---|---|---|
| 4,317,055 | A | 2/1982 | Yoshida et al. |
| 4,540,954 | A | 9/1985 | Apel |
| 4,543,535 | A | 9/1985 | Ayasli |
| 4,620,207 | A | 10/1986 | Calviello |
| 4,788,511 | A | 11/1988 | Schindler |
| 5,028,879 | A | 7/1991 | Kim |
| 5,046,155 | A | 9/1991 | Beyer et al. |

(Continued)

FOREIGN PATENT DOCUMENTS

| | | |
|---|---|---|
| EP | 1187229 A1 | 3/2002 |
| EP | 1826041 A1 | 8/2007 |

(Continued)

OTHER PUBLICATIONS

International Search Report and Written Opinion for PCT/US2013/056105, mailed Feb. 12, 2014, 15 pages.

(Continued)

*Primary Examiner* — Hieu Nguyen
(74) *Attorney, Agent, or Firm* — Withrow & Terranova, P.L.L.C.

(57) ABSTRACT

A wide bandwidth radio frequency amplifier is disclosed. The wide bandwidth radio frequency amplifier has a first signal path having a first input and a first output along with a first dual gate field effect transistor having a first-first gate coupled to the first input and a first drain coupled to the first output. The wide bandwidth radio frequency amplifier also includes a second signal path having a second input and a second output and a second dual gate field effect transistor having a second-first gate coupled to the second input and a second drain coupled to the second output.

22 Claims, 8 Drawing Sheets

(56) References Cited

U.S. PATENT DOCUMENTS

| | | | |
|---|---|---|---|
| 5,047,355 A | 9/1991 | Huber et al. | |
| 5,107,323 A | 4/1992 | Knolle et al. | |
| 5,118,993 A | 6/1992 | Yang | |
| 5,208,547 A | 5/1993 | Schindler | |
| 5,227,734 A | 7/1993 | Schindler et al. | |
| 5,306,656 A | 4/1994 | Williams et al. | |
| 5,361,038 A | 11/1994 | Allen et al. | |
| 5,365,197 A | 11/1994 | Ikalainen | |
| 5,389,571 A | 2/1995 | Takeuchi et al. | |
| 5,414,387 A | 5/1995 | Nakahara et al. | |
| 5,485,118 A | 1/1996 | Chick | |
| 5,608,353 A | 3/1997 | Pratt | |
| 5,629,648 A | 5/1997 | Pratt | |
| 5,698,870 A | 12/1997 | Nakano et al. | |
| 5,742,205 A * | 4/1998 | Cowen et al. | 330/269 |
| 5,764,673 A | 6/1998 | Kawazu et al. | |
| 5,834,326 A | 11/1998 | Miyachi et al. | |
| 5,843,590 A | 12/1998 | Miura et al. | |
| 5,864,156 A | 1/1999 | Juengling | |
| 5,874,747 A | 2/1999 | Redwing et al. | |
| 5,880,640 A | 3/1999 | Dueme | |
| 5,914,501 A | 6/1999 | Antle et al. | |
| 5,949,140 A | 9/1999 | Nishi et al. | |
| 6,049,250 A | 4/2000 | Kintis et al. | |
| 6,064,082 A | 5/2000 | Kawai et al. | |
| 6,110,757 A | 8/2000 | Udagawa et al. | |
| 6,130,579 A | 10/2000 | Iyer et al. | |
| 6,133,589 A | 10/2000 | Krames et al. | |
| 6,177,685 B1 | 1/2001 | Teraguchi et al. | |
| 6,191,656 B1 | 2/2001 | Nadler | |
| 6,229,395 B1 | 5/2001 | Kay | |
| 6,265,943 B1 | 7/2001 | Dening et al. | |
| 6,271,727 B1 | 8/2001 | Schmukler | |
| 6,285,239 B1 | 9/2001 | Iyer et al. | |
| 6,306,709 B1 | 10/2001 | Miyagi et al. | |
| 6,307,364 B1 | 10/2001 | Augustine | |
| 6,313,705 B1 | 11/2001 | Dening et al. | |
| 6,329,809 B1 | 12/2001 | Dening et al. | |
| 6,333,677 B1 | 12/2001 | Dening | |
| 6,342,815 B1 | 1/2002 | Kobayashi | |
| 6,356,150 B1 | 3/2002 | Spears et al. | |
| 6,369,656 B2 | 4/2002 | Dening et al. | |
| 6,369,657 B2 | 4/2002 | Dening et al. | |
| 6,373,318 B1 | 4/2002 | Dohnke et al. | |
| 6,376,864 B1 | 4/2002 | Wang | |
| 6,377,125 B1 | 4/2002 | Pavio et al. | |
| 6,384,433 B1 | 5/2002 | Barratt et al. | |
| 6,387,733 B1 | 5/2002 | Holyoak et al. | |
| 6,392,487 B1 | 5/2002 | Alexanian | |
| 6,400,226 B2 | 6/2002 | Sato | |
| 6,404,287 B2 | 6/2002 | Dening et al. | |
| 6,448,793 B1 | 9/2002 | Barratt et al. | |
| 6,455,877 B1 | 9/2002 | Ogawa et al. | |
| 6,475,916 B1 | 11/2002 | Lee et al. | |
| 6,477,682 B2 | 11/2002 | Cypher | |
| 6,521,998 B1 | 2/2003 | Teraguchi et al. | |
| 6,525,611 B1 | 2/2003 | Dening et al. | |
| 6,528,983 B1 | 3/2003 | Augustine | |
| 6,560,452 B1 | 5/2003 | Shealy | |
| 6,566,963 B1 | 5/2003 | Yan et al. | |
| 6,589,877 B1 | 7/2003 | Thakur | |
| 6,593,597 B2 | 7/2003 | Sheu | |
| 6,608,367 B1 | 8/2003 | Gibson et al. | |
| 6,614,281 B1 | 9/2003 | Baudelot et al. | |
| 6,621,140 B1 | 9/2003 | Gibson et al. | |
| 6,624,452 B2 | 9/2003 | Yu et al. | |
| 6,627,552 B1 | 9/2003 | Nishio et al. | |
| 6,633,073 B2 | 10/2003 | Rezvani et al. | |
| 6,633,195 B2 | 10/2003 | Baudelot et al. | |
| 6,639,470 B1 | 10/2003 | Andrys et al. | |
| 6,656,271 B2 | 12/2003 | Yonehara et al. | |
| 6,657,592 B2 | 12/2003 | Dening et al. | |
| 6,660,606 B2 | 12/2003 | Miyabayashi et al. | |
| 6,701,134 B1 | 3/2004 | Epperson | |
| 6,701,138 B2 | 3/2004 | Epperson et al. | |
| 6,706,576 B1 | 3/2004 | Ngo et al. | |
| 6,720,831 B2 | 4/2004 | Dening et al. | |
| 6,723,587 B2 | 4/2004 | Cho et al. | |
| 6,724,252 B2 | 4/2004 | Ngo et al. | |
| 6,727,762 B1 | 4/2004 | Kobayashi | |
| 6,748,204 B1 | 6/2004 | Razavi et al. | |
| 6,750,158 B2 | 6/2004 | Ogawa et al. | |
| 6,750,482 B2 | 6/2004 | Seaford et al. | |
| 6,759,907 B2 | 7/2004 | Orr et al. | |
| 6,802,902 B2 | 10/2004 | Beaumont et al. | |
| 6,815,722 B2 | 11/2004 | Lai et al. | |
| 6,815,730 B2 | 11/2004 | Yamada | |
| 6,822,842 B2 | 11/2004 | Friedrichs et al. | |
| 6,861,677 B2 | 3/2005 | Chen | |
| 6,943,631 B2 | 9/2005 | Scherrer et al. | |
| 7,015,512 B2 | 3/2006 | Park et al. | |
| 7,026,665 B1 | 4/2006 | Smart et al. | |
| 7,033,961 B1 | 4/2006 | Smart et al. | |
| 7,042,150 B2 | 5/2006 | Yasuda | |
| 7,052,942 B1 | 5/2006 | Smart et al. | |
| 7,211,822 B2 | 5/2007 | Nagahama et al. | |
| 7,408,182 B1 | 8/2008 | Smart et al. | |
| 7,449,762 B1 | 11/2008 | Singh | |
| 7,459,356 B1 | 12/2008 | Smart et al. | |
| 7,557,421 B1 | 7/2009 | Shealy et al. | |
| 7,719,055 B1 | 5/2010 | McNutt et al. | |
| 7,768,758 B2 | 8/2010 | Maier et al. | |
| 7,804,262 B2 | 9/2010 | Schuster et al. | |
| 7,935,983 B2 | 5/2011 | Saito et al. | |
| 7,968,391 B1 | 6/2011 | Smart et al. | |
| 7,974,322 B2 | 7/2011 | Ueda et al. | |
| 8,017,981 B2 | 9/2011 | Sankin et al. | |
| 8,405,068 B2 | 3/2013 | O'Keefe | |
| 8,502,258 B2 | 8/2013 | O'Keefe | |
| 8,633,518 B2 | 1/2014 | Suh et al. | |
| 8,692,294 B2 | 4/2014 | Chu et al. | |
| 8,785,976 B2 | 7/2014 | Nakajima et al. | |
| 2001/0040246 A1 | 11/2001 | Ishii | |
| 2001/0054848 A1 | 12/2001 | Baudelot et al. | |
| 2002/0031851 A1 | 3/2002 | Linthicum et al. | |
| 2002/0048302 A1 | 4/2002 | Kimura | |
| 2002/0079508 A1 | 6/2002 | Yoshida | |
| 2003/0003630 A1 | 1/2003 | Iimura et al. | |
| 2003/0122139 A1 | 7/2003 | Meng et al. | |
| 2003/0160307 A1 | 8/2003 | Gibson et al. | |
| 2003/0160317 A1 | 8/2003 | Sakamoto et al. | |
| 2003/0206440 A1 | 11/2003 | Wong | |
| 2003/0209730 A1 | 11/2003 | Gibson et al. | |
| 2003/0218183 A1 | 11/2003 | Micovic et al. | |
| 2004/0070003 A1 | 4/2004 | Gaska et al. | |
| 2004/0130037 A1 | 7/2004 | Mishra et al. | |
| 2004/0241916 A1 | 12/2004 | Chau et al. | |
| 2005/0139868 A1 | 6/2005 | Anda | |
| 2005/0189559 A1 | 9/2005 | Saito et al. | |
| 2005/0189562 A1 | 9/2005 | Kinzer et al. | |
| 2005/0194612 A1 | 9/2005 | Beach | |
| 2005/0212049 A1 | 9/2005 | Onodera | |
| 2005/0225912 A1 | 10/2005 | Pant et al. | |
| 2005/0271107 A1 | 12/2005 | Murakami et al. | |
| 2006/0043385 A1 | 3/2006 | Wang et al. | |
| 2006/0068601 A1 | 3/2006 | Lee et al. | |
| 2006/0124960 A1 | 6/2006 | Hirose et al. | |
| 2006/0243988 A1 | 11/2006 | Narukawa et al. | |
| 2007/0093009 A1 | 4/2007 | Baptist et al. | |
| 2007/0295985 A1 | 12/2007 | Weeks, Jr. et al. | |
| 2008/0023706 A1 | 1/2008 | Saito et al. | |
| 2008/0073752 A1 | 3/2008 | Asai et al. | |
| 2008/0112448 A1 | 5/2008 | Ueda et al. | |
| 2008/0121875 A1 | 5/2008 | Kim | |
| 2008/0142837 A1 | 6/2008 | Sato et al. | |
| 2008/0179737 A1 | 7/2008 | Haga et al. | |
| 2008/0190355 A1 | 8/2008 | Chen et al. | |
| 2008/0272382 A1 | 11/2008 | Kim et al. | |
| 2008/0272422 A1 | 11/2008 | Min | |
| 2008/0283821 A1 | 11/2008 | Park et al. | |
| 2008/0308813 A1 | 12/2008 | Suh et al. | |
| 2009/0072269 A1 | 3/2009 | Suh et al. | |
| 2009/0090984 A1 | 4/2009 | Khan et al. | |
| 2009/0146185 A1 | 6/2009 | Suh et al. | |

(56) References Cited

U.S. PATENT DOCUMENTS

| | | | |
|---|---|---|---|
| 2009/0146186 | A1 | 6/2009 | Kub et al. |
| 2009/0166677 | A1 | 7/2009 | Shibata et al. |
| 2009/0278137 | A1 | 11/2009 | Sheridan et al. |
| 2010/0025657 | A1 | 2/2010 | Nagahama et al. |
| 2010/0133567 | A1 | 6/2010 | Son |
| 2010/0187575 | A1 | 7/2010 | Baumgartner et al. |
| 2010/0207164 | A1 | 8/2010 | Shibata et al. |
| 2010/0230656 | A1 | 9/2010 | O'Keefe |
| 2010/0230717 | A1 | 9/2010 | Saito |
| 2010/0258898 | A1 | 10/2010 | Lahreche |
| 2011/0017972 | A1 | 1/2011 | O'Keefe |
| 2011/0025422 | A1 | 2/2011 | Marra et al. |
| 2011/0095337 | A1 | 4/2011 | Sato |
| 2011/0101300 | A1 | 5/2011 | O'Keefe |
| 2011/0115025 | A1 | 5/2011 | Okamoto |
| 2011/0127586 | A1 | 6/2011 | Bobde et al. |
| 2011/0163342 | A1 | 7/2011 | Kim et al. |
| 2011/0175142 | A1 | 7/2011 | Tsurumi et al. |
| 2011/0199148 | A1 | 8/2011 | Iwamura |
| 2011/0211289 | A1 | 9/2011 | Kosowsky et al. |
| 2011/0242921 | A1 | 10/2011 | Tran et al. |
| 2011/0290174 | A1 | 12/2011 | Leonard et al. |
| 2012/0018735 | A1 | 1/2012 | Ishii |
| 2012/0086497 | A1 | 4/2012 | Vorhaus |
| 2012/0126240 | A1 | 5/2012 | Won |
| 2012/0199875 | A1 | 8/2012 | Bhalla et al. |
| 2012/0211802 | A1 | 8/2012 | Tamari |
| 2012/0218783 | A1 | 8/2012 | Imada |
| 2012/0262220 | A1 | 10/2012 | Springett |
| 2013/0277687 | A1 | 10/2013 | Kobayashi et al. |
| 2013/0280877 | A1 | 10/2013 | Kobayashi et al. |

FOREIGN PATENT DOCUMENTS

| | | |
|---|---|---|
| JP | 10242584 A | 9/1998 |
| JP | 2000031535 A | 1/2000 |
| JP | 2003332618 A | 11/2003 |
| JP | 2008148511 A | 6/2008 |
| JP | 2008258419 A | 10/2008 |
| KR | 20070066051 A | 6/2007 |
| WO | 2004051707 A3 | 6/2004 |
| WO | 2011162243 A1 | 12/2011 |

OTHER PUBLICATIONS

Chang, S.J. et al, "Improved ESD protection by combining InGaN-GaN MQW LEDs with GaN Schottky diodes," IEEE Electron Device Letters, Mar. 2003, vol. 24, No. 3, pp. 129-131.

Chao, C-H., et al., "Theoretical demonstration of enhancement of light extraction of flip-chip GaN light-emitting diodes with photonic crystals," Applied Physics Letters, vol. 89, 2006, 4 pages.

Fath, P. et al., "Mechanical wafer engineering for high efficiency solar cells: An investigation of the induced surface damage," Conference Record of the Twenty-Fourth IEEE Photovoltaic Specialists Conference, Dec. 5-9, 1994, vol. 2, pp. 1347-1350.

Han, D.S. et al., "Improvement of Light Extraction Efficiency of Flip-Chip Light-Emitting Diode by Texturing the Bottom Side Surface of Sapphire Substrate," IEEE Photonics Technology Letters, Jul. 1, 2006, vol. 18, No. 13, pp. 1406-1408.

Hibbard, D.L. et al., "Low Resistance High Reflectance Contacts to p-GaN Using Oxidized Ni/Au and Al or Ag," Applied Physics Letters, vol. 83 No. 2, Jul. 14, 2003, pp. 311-313.

Lee, S.J., "Study of photon extraction efficiency in InGaN light-emitting diodes depending on chip structures and chip-mount schemes," Optical Engineering, SPIE, Jan. 2006, vol. 45, No. 1, 14 pages.

Shchekin, O.B. et al., "High performance thin-film flip-chip InGaN-GaN light-emitting diodes," Applied Physics Letters, vol. 89, 071109, Aug. 2006, 4 pages.

Wierer, J. et al., "High-power AlGaInN flip-chip light-emitting diodes," Applied Physics Letters, vol. 78 No. 22, May 28, 2001, pp. 3379-3381.

Windisch, R. et al., "40% Efficient Thin-Film Surface-Textured Light-Emitting Diodes by Optimization of Natural Lithography," IEEE Transactions on Electron Devices, Jul. 2000, vol. 47, No. 7, pp. 1492-1498.

Windisch, R. et al., "Impact of texture-enhanced transmission on high-efficiency surface-textured light-emitting diodes," Applied Physics Letters, Oct. 8, 2001, vol. 79, No. 15, pp. 2315-2317.

Advisory Action for U.S. Appl. No. 10/620,205, mailed Feb. 15, 2005, 2 pages.

Final Office Action for U.S. Appl. No. 10/620,205, mailed Dec. 16, 2004, 9 pages.

Non-Final Office Action for U.S. Appl. No. 10/620,205, mailed Jul. 23, 2004, 7 pages.

Non-Final Office Action for U.S. Appl. No. 10/620,205, mailed May 3, 2005, 10 pages.

Notice of Allowance for U.S. Appl. No. 10/620,205, mailed Dec. 8, 2005, 4 pages.

Non-Final Office Action for U.S. Appl. No. 10/689,980, mailed Jan. 26, 2005, 7 pages.

Non-Final Office Action for U.S. Appl. No. 10/689,980, mailed May 12, 2005, 8 pages.

Non-Final Office Action for U.S. Appl. No. 12/841,225 mailed Dec. 22, 2011, 8 pages.

Non-Final Office Action for U.S. Appl. No. 11/397,279, mailed Oct. 31, 2007, 7 pages.

Notice of Allowance for U.S. Appl. No. 11/397,279, mailed Apr. 17, 2008, 7 pages.

Final Office Action for U.S. Appl. No. 10/689,979, mailed Jun. 29, 2005, 16 pages.

Non-Final Office Action for U.S. Appl. No. 10/689,979, mailed Jan. 11, 2005, 14 pages.

Notice of Allowance for U.S. Appl. No. 10/689,979, mailed Oct. 26, 2005, 6 pages.

Notice of Allowance for U.S. Appl. No. 12/841,225, mailed Nov. 9, 2012, 5 pages.

Non-Final Office Action for U.S. Appl. No. 11/360,734, mailed Jan. 18, 2008, 10 pages.

Notice of Allowance for U.S. Appl. No. 11/360,734, mailed Aug. 7, 2008, 6 pages.

Non-Final Office Action for U.S. Appl. No. 12/841,257 mailed Jan. 5, 2012, 13 pages.

Advisory Action for U.S. Appl. No. 11/937,207, mailed Feb. 2, 2010, 2 pages.

Final Office Action for U.S. Appl. No. 11/937,207, mailed Nov. 19, 2009, 9 pages.

Non-Final Office Action for U.S. Appl. No. 11/937,207, mailed Mar. 18, 2010, 10 pages.

Non-Final Office Action for U.S. Appl. No. 11/937,207, mailed May 29, 2009, 11 pages.

Notice of Allowance for U.S. Appl. No. 11/937,207, mailed Feb. 28, 2011, 8 pages.

Quayle Action for U.S. Appl. No. 11/937,207, mailed Nov. 24, 2010, 4 pages.

Final Office Action for U.S. Appl. No. 11/458,833, mailed Dec. 15, 2008, 13 pages.

Non-Final Office Action for U.S. Appl. No. 11/458,833, mailed Apr. 1, 2008, 10 pages.

Notice of Allowance for U.S. Appl. No. 11/458,833, mailed Mar. 9, 2009, 7 pages.

Invitation to Pay Fees for PCT/US2013/056105, mailed Nov. 5, 2013, 7 pages.

International Search Report and Written Opinion for PCT/US2013/056126, mailed Oct. 25, 2013, 10 pages.

International Search Report and Written Opinion for PCT/US2013/056132, mailed Oct. 10, 2013, 11 pages.

International Search Report and Written Opinion for PCT/US2013/056187, mailed Oct. 10, 2013, 11 pages.

International Search Report for GB0902558.6, issued Jun. 15, 2010, by the UK Intellectual Property Office, 2 pages.

Examination Report for British Patent Application No. 0902558.6, mailed Nov. 16, 2012, 5 pages.

Examination Report for British Patent Application No. GB0902558.6, issued Feb. 28, 2013, 2 pages.

(56) References Cited

OTHER PUBLICATIONS

Non-Final Office Action for U.S. Appl. No. 12/705,869, mailed Feb. 9, 2012, 10 pages.
Notice of Allowance for U.S. Appl. No. 12/705,869, mailed Apr. 4, 2013, 9 pages.
Notice of Allowance for U.S. Appl. No. 12/705,869, mailed Jul. 19, 2012, 8 pages.
Advisory Action for U.S. Appl. No. 12/841,225, mailed Apr. 16, 2012, 3 pages.
Final Office Action for U.S. Appl. No. 12/841,225 mailed Feb. 1, 2012, 9 pages.
Non-Final Office Action for U.S. Appl. No. 12/841,225, mailed May 2, 2012, 10 pages.
Non-Final Office Action for U.S. Appl. No. 13/927,182, mailed May 1, 2014, 7 pages.
Non-Final Office Action for U.S. Appl. No. 13/973,482, mailed May 23, 2014, 8 pages.
Non-Final Office Action for U.S. Appl. No. 13/795,986, mailed Apr. 24, 2014, 13 pages.
Boutros, K.S., et al., "5W GaN MMIC for Millimeter-Wave Applications," 2006 Compound Semiconductor Integrated Circuit Symposium, Nov. 2006, pp. 93-95.
Cho, H., et al., "High Density Plasma Via Hole Etching in Sic," Journal of Vacuum Science & Technology A: Surfaces, and Films, vol. 19, No. 4, Jul./Aug. 2001, pp. 1878-1881.
Darwish, A.M., et al., "Dependence of GaN HEMT Millimeter-Wave Performance on Temperature," IEEE Transactions on Microwave Theory and Techniques, vol. 57, No. 12, Dec. 2009, pp. 3205-3211.
Krüger, Olaf, et al., "Laser-Assisted Processing of VIAs for AlGaN/GaN HEMTs on SiC Substrates," IEEE Electron Device Letters, vol. 27, No. 6, Jun. 2006, pp. 425-427.
Sheppard, S.T., et al., "High Power Demonstration at 10 GHz with GaN/AlGaN HEMT Hybrid Amplifiers," 2000 Device Research Conference, Conference Digest, Jun. 2000, pp. 37-38.
Non-Final Office Action for U.S. Appl. No. 13/795,926, mailed Dec. 19, 2014, 14 pages.
Non-Final Office Action for U.S. Appl. No. 13/871,526, mailed Dec. 16, 2014, 17 pages.
Final Office Action for U.S. Appl. No. 13/910,202, mailed Jan. 20, 2015, 10 pages.
Notice of Allowance for U.S. Appl. No. 13/914,060, mailed Nov. 13, 2014, 8 pages.
Final Office Action for U.S. Appl. No. 13/966,400, mailed Dec. 3, 2014, 8 pages.
Final Office Action for U.S. Appl. No. 13/795,986, mailed Dec. 5, 2014, 16 pages.
Author Unknown, "CGHV1J006D: 6 W, 18.0 GHz, GaN HEMT Die," Cree, Inc., 2014, 9 pages.
Non-Final Office Action for U.S. Appl. No. 13/910,202, mailed Sep. 25, 2014, 9 pages.
Final Office Action for U.S. Appl. No. 13/927,182, mailed Sep. 17, 2014, 10 pages.
Non-Final Office Action for U.S. Appl. No. 13/974,488, mailed Oct. 28, 2014, 8 pages.
Non-Final Office Action for U.S. Appl. No. 13/966,400, mailed Sep. 3, 2014, 9 pages.
Non-Final Office Action for U.S. Appl. No. 13/957,698, mailed Nov. 5, 2014, 11 pages.
Final Office Action for U.S. Appl. No. 13/973,482, mailed Nov. 5, 2014, 9 pages.
International Preliminary Report on Patentability for PCT/US2013/056105, mailed Mar. 5, 2015, 12 pages.
International Preliminary Report on Patentability for PCT/US2013/056126, mailed Mar. 5, 2015, 7 pages.
International Preliminary Report on Patentability for PCT/US2013/056132, mailed Mar. 5, 2015, 9 pages.
International Preliminary Report on Patentability for PCT/US2013/056187, mailed Mar. 12, 2015, 9 pages.
Advisory Action for U.S. Appl. No. 13/910,202, mailed Apr. 6, 2015, 3 pages.
Final Office Action for U.S. Appl. No. 13/974,488, mailed Feb. 20, 2015, 8 pages.
Notice of Allowance for U.S. Appl. No. 13/966,400, mailed Feb. 20, 2015, 8 pages.
Notice of Allowance for U.S. Appl. No. 13/957,698, mailed Mar. 30, 2015, 7 pages.
Notice of Allowance for U.S. Appl. No. 13/795,986, mailed Mar. 6, 2015, 8 pages.
Non-Final Office Action for U.S. Appl. No. 14/067,019, mailed Mar. 25, 2015, 7 pages.
Notice of Allowance for U.S. Appl. No. 13/795,926, mailed Apr. 27, 2015, 8 pages.
Final Office Action for U.S. Appl. No. 13/871,526, mailed Jun. 17, 2015, 11 pages.
Notice of Allowance for U.S. Appl. No. 13/910,202, mailed May 14, 2015, 9 pages.
Notice of Allowance for U.S. Appl. No. 13/974,488, mailed May 29, 2015, 9 pages.
Corrected/Supplemental Notice of Allowability for U.S. Appl. No. 13/957,689, mailed May 20, 2015, 3 pages.
Corrected/Supplement Notice of Allowability for U.S. Appl. No. 13/957,689, mailed Jun. 9, 2015, 4 pages.
Notice of Allowance for U.S. Appl. No. 13/973,482, mailed May 4, 2015, 7 pages.
Notice of Allowance for U.S. Appl. No. 13/957,698, mailed Jul. 20, 2015, 7 pages.

* cited by examiner

WIDE BANDWIDTH RADIO FREQUENCY AMPLIER HAVING DUAL GATE TRANSISTORS

RELATED APPLICATIONS

This application claims the benefit of U.S. provisional patent application No. 61/672,060, filed Jul. 16, 2012, the disclosure of which is incorporated herein by reference in its entirety.

FIELD OF THE DISCLOSURE

The present disclosure relates to signal amplifiers and in particular to wide bandwidth radio frequency amplifiers having dual gate transistors in signal paths for amplifying signals.

BACKGROUND

Wide bandwidth radio frequency amplifiers are used to amplify a plurality of radio frequency channels over a bandwidth that is typically around about 1000 MHz wide. Due to their ability to amplify signals over such a large bandwidth, wide bandwidth radio frequency amplifiers are key components in cable television (CATV) infrastructure. An important performance criterion for wide bandwidth radio frequency amplifiers for CATV infrastructure includes linearity as measured relative to composite intermodulation noise (CIN) and composite triple beat (CTB). Other important criteria are linearity and gain performance over temperature.

A particularly useful wide bandwidth radio frequency amplifier configuration for CATV infrastructure is known as a push-pull cascode amplifier. FIG. 1 is a simplified schematic of a related art wide bandwidth radio frequency amplifier 10 having a push-pull cascode configuration suitable for radio frequency signal amplification. The related art wide bandwidth radio frequency amplifier 10 includes a first signal path 12 having a first input 14 and a first output 16. A first field effect transistor FET1 and a second field effect transistor FET2 in the first signal path 12 are coupled in a cascode configuration. The first field effect transistor FET1 is manufactured using gallium arsenide (GaAs) technology on a first single amplifier die 18, while the second field effect transistor FET2 is manufactured using gallium nitride (GaN) technology on a second single amplifier die 20. A first gate G1 of the first field effect transistor FET1 is coupled to the first input 14 and a source S1 is coupled to ground GND through a first resistor R1. A drain D1 of the first field effect transistor FET1 is coupled to a source S2 of the second field effect transistor FET2. A drain D2 of the second field effect transistor FET2 is coupled to the first output 16.

The related art wide bandwidth radio frequency amplifier 10 also includes a second signal path 22 having a second input 24 and a second output 26. A third field effect transistor FET3 and a fourth field effect transistor FET4 in the second signal path 22 are coupled in a cascode configuration. The third field effect transistor FET3 is manufactured using gallium arsenide (GaAs) technology on a third single amplifier die 28, while the fourth field effect transistor FET4 is manufactured using gallium nitride (GaN) technology on a fourth single amplifier die 30. A gate G3 of the third field effect transistor FET3 is coupled to the second input 24, a source S3 is coupled to ground GND through a second resistor R2. A drain D3 of the third field effect transistor FET3 is coupled to a source S4 of the fourth field effect transistor FET4. A drain D4 of the fourth field effect transistor FET4 is coupled to the second output 26. A third resistor R3, coupled between the first source S1 and the third source S3, along with a fourth resistor R4, coupled between the second gate G2 and the fourth gate G4, provide symmetry of operation that generates a virtual ground, which in FIG. 1 is represented by a dashed line.

The related art wide bandwidth radio frequency amplifier 10 further includes an unbalanced-to-balanced transformer TF1 having a radio frequency input RFIN at a pad P1 that is coupled to ground GND through a first winding N1. A first phase output 32 is coupled to the first input 14 of the first signal path 12, and a second phase output 34 coupled to the second input 24 of the second signal path 22. A balanced-to-unbalanced transformer TF2 has a first input winding N3 with a first phase input 36 coupled to the first output 16 of the first signal path 12, and a second input winding N4 with a second phase input 38 is coupled to the second output 26 of the second signal path 22. The first input winding N3 and the second input winding N4 are coupled in series at a node 40. A supply voltage VDD is provided through a pad P2 that couples to the node 40. A radio frequency output RFOUT at a pad P3 is coupled to ground GND through an output winding N5.

While the related art wide bandwidth radio frequency amplifier 10 performs relatively well, it is desirable to realize a wide bandwidth radio frequency amplifier with improved linear performance with regard to CIN and CTB as well as realize improved linear performance over temperature with higher gain. Moreover, it is desirable to reduce the number of passive components and active component dies needed for proper operation of wide bandwidth radio frequency amplifiers.

SUMMARY

The present disclosure provides a wide bandwidth radio frequency amplifier. The wide bandwidth radio frequency amplifier has a first signal path having a first input and a first output along with a first dual gate field effect transistor having a first-first gate coupled to the first input and a first drain coupled to the first output. The wide bandwidth radio frequency amplifier also includes a second signal path having a second input and a second output and a second dual gate field effect transistor having a second-first gate coupled to the second input and a second drain coupled to the second output.

In at least one embodiment, the wide bandwidth radio frequency amplifier further includes an unbalanced-to-balanced transformer having a radio frequency input, a first phase output coupled to the first input of the first signal path, and a second phase output coupled to the second input of the second signal path. Also included is a balanced-to-unbalanced transformer having a first phase input coupled to the first output of the first signal path, a second phase input coupled to the second output of the second signal path, and a radio frequency output.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
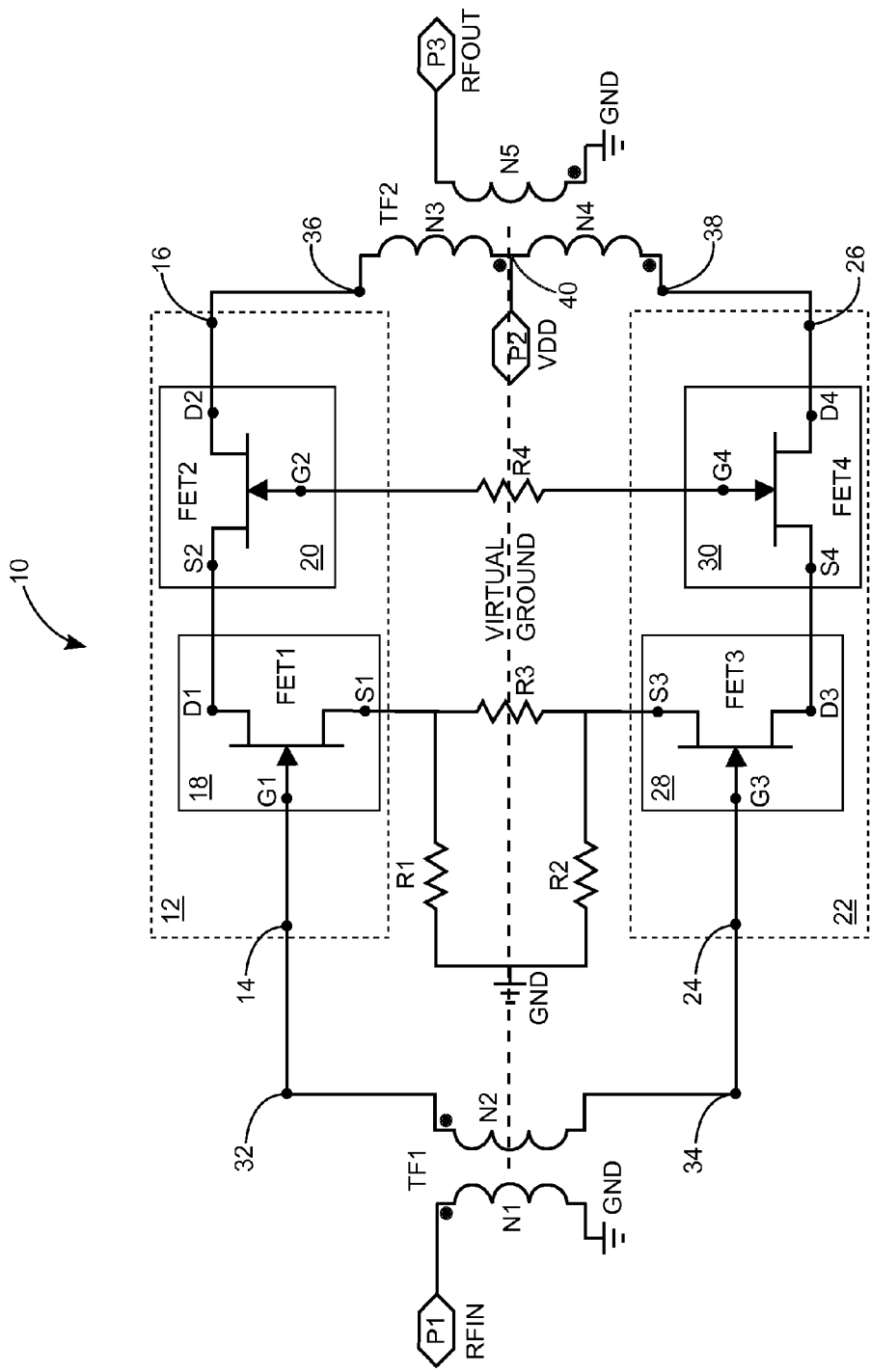
FIG. 1 is a simplified schematic of a related art wide bandwidth radio frequency amplifier having a push-pull cascode configuration.
Figure 2:
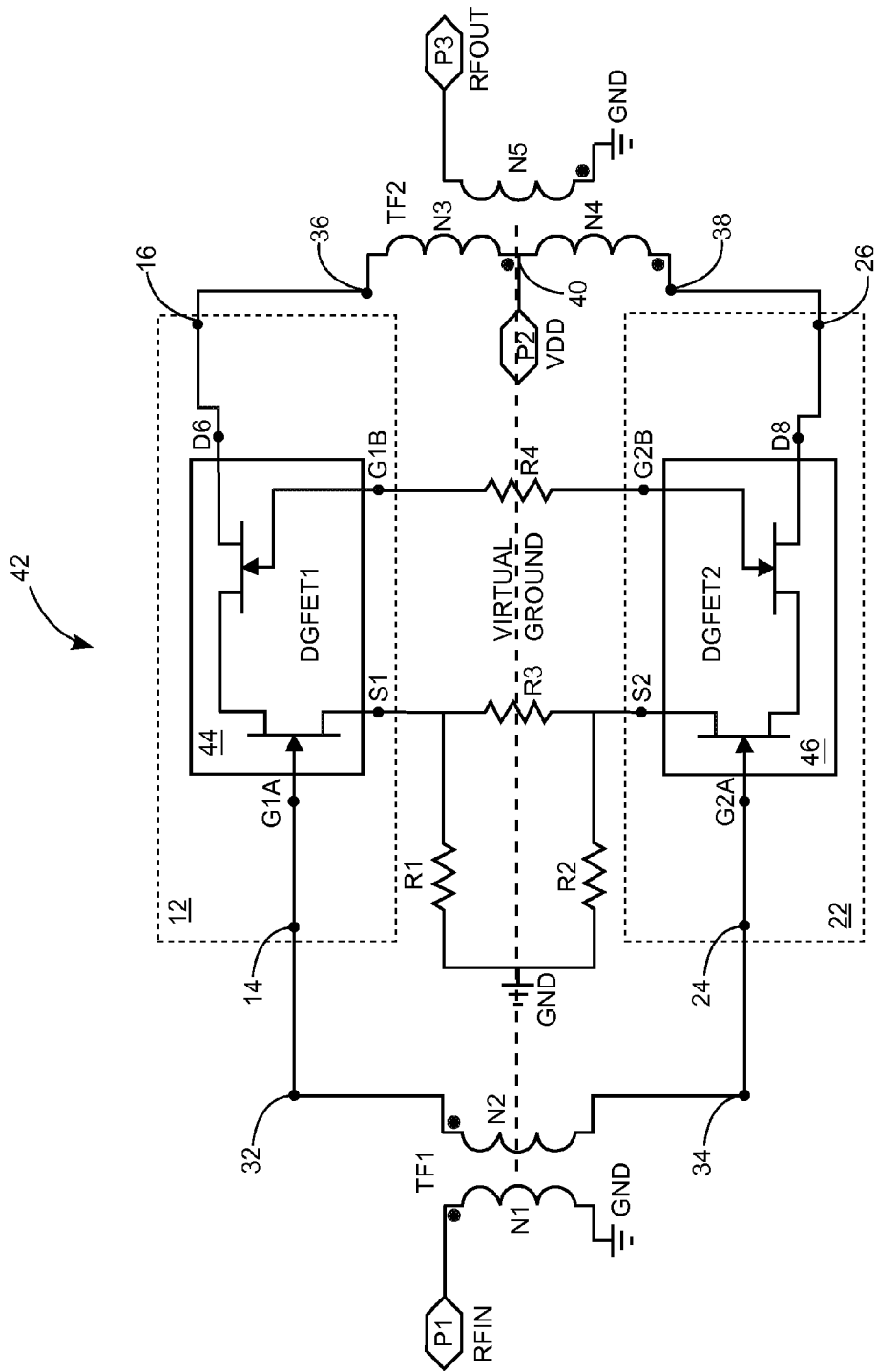
FIG. 2 is a simplified schematic of a wide bandwidth radio frequency amplifier of the present disclosure.

FIG. 2 is a simplified schematic of a wide bandwidth radio frequency amplifier 42 that in accordance with the present disclosure provides improved linear performance with regard to CIN and CTB as well as improved linear performance over temperature with higher gain. Moreover, the wide bandwidth radio frequency amplifier 42 reduces the number of passive components and active component dies needed for proper operation of wide bandwidth radio frequency amplifiers. In particular, the wide bandwidth radio frequency amplifier 42 provides a first dual gate field effect transistor DGFET1 on a first cascode amplifier die 44 in place of the first single amplifier die 18 (FIG. 1) and the second single amplifier die 20 (FIG. 1) that include the first field effect transistor FET1 (FIG. 1) and the second field effect transistor FET2 (FIG. 1), respectively. As such, a first-first gate G1A of the first dual gate field effect transistor DGFET1 is coupled to the first input 14 of the first signal path 12. A first source S1 of the first dual gate field effect transistor DGFET1 is coupled to ground GND through the first resistor R1. A drain D6 of the first dual gate field effect transistor DGFET1 is coupled to the first output 16.

The wide bandwidth radio frequency amplifier 42 also provides a second dual gate field effect transistor DGFET2 on a second cascode amplifier die 46 in place of the third single amplifier die 28 (FIG. 1) and the fourth single amplifier die 30 (FIG. 1) that include the third field effect transistor FET3 (FIG. 1) and the fourth field effect transistor FET4 (FIG. 1), respectively. As such, a second-first gate G2A of the second dual gate field effect transistor DGFET2 is coupled to the second input 24 of the second signal path 22. A second source S2 of the second dual gate field effect transistor DGFET2 is coupled to ground GND through the second resistor R2. A second drain D8 of the second dual gate field effect transistor DGFET2 is coupled to the second output 26. The third resistor R3 coupled between the first source S1 and the second source S2 along with the fourth resistor R4 coupled between a first-second gate G1B and a second-second gate G2B provides symmetry of operation that generates a virtual ground, which in FIG. 2 is represented by a dashed line.

An advantage that the wide bandwidth radio frequency amplifier 42 has over the related art wide bandwidth radio frequency amplifier 10 (FIG. 1) is that the gallium arsenide (GaAs) technology of the first single amplifier die 18 and the third single amplifier die 28 combined with the gallium nitride (GaN) technology of the second single amplifier die 20 and the fourth single amplifier die 30 is replaced by all GaN technology of the first dual gate field effect transistor DGFET1 and the second dual gate field effect transistor DGFET2. As a result, any complications due to mixing GaAs and GaN technologies are eliminated, resulting in improved performance and reduced manufacturing costs.

Figure 3:
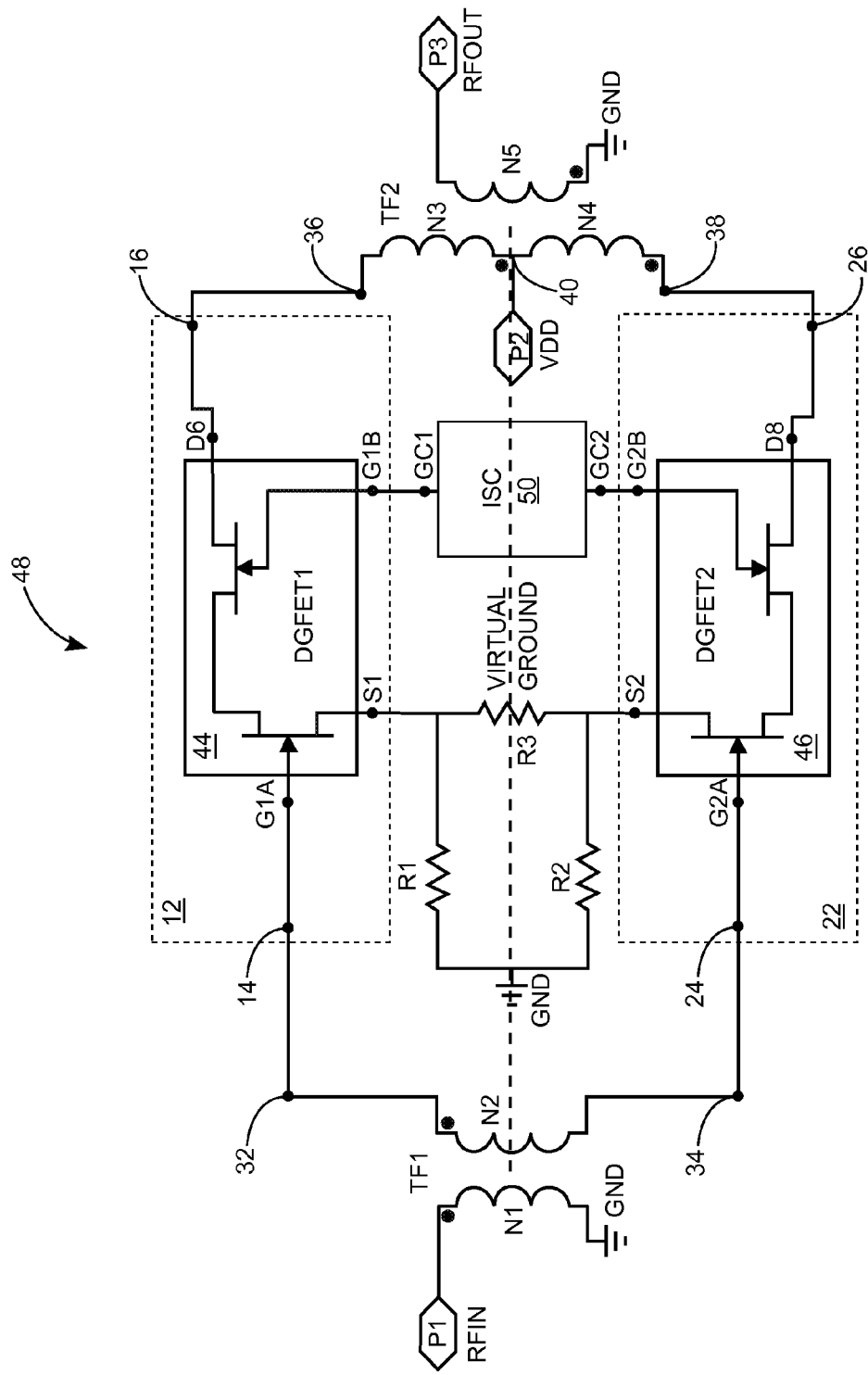
FIG. 3 is a simplified schematic of a wide bandwidth radio frequency amplifier of the present disclosure that further includes an integrated stabilization circuit (ISC).

Turning now to FIG. 3, another embodiment of the present disclosure provides a wide bandwidth radio frequency amplifier 48 having an integrated stabilization circuit (ISC) 50 that increases stability of both the first dual gate field effect transistor DGFET1 and the second dual gate field effect transistor DGFET2. Incorporation of the ISC 50 is preferred because a challenge exists with the cascode configuration due to high forward gain (scattering parameter S21) combined with reduced reverse isolation (scattering parameter S12) at relatively low to moderate bias. For instance, the scattering parameter S12 associated with reduced reverse isolation can be degraded in cascode configurations on cascode amplifier dies such as the first cascode amplifier die 44 and the second cascode amplifier die 46. In order to offset the degraded scattering parameter S12, the ISC 50 couples between the first-second gate G1B and the second-second gate G2B via a first gate control output (GC1) and a second gate control output (GC2), respectively.

Figure 4:
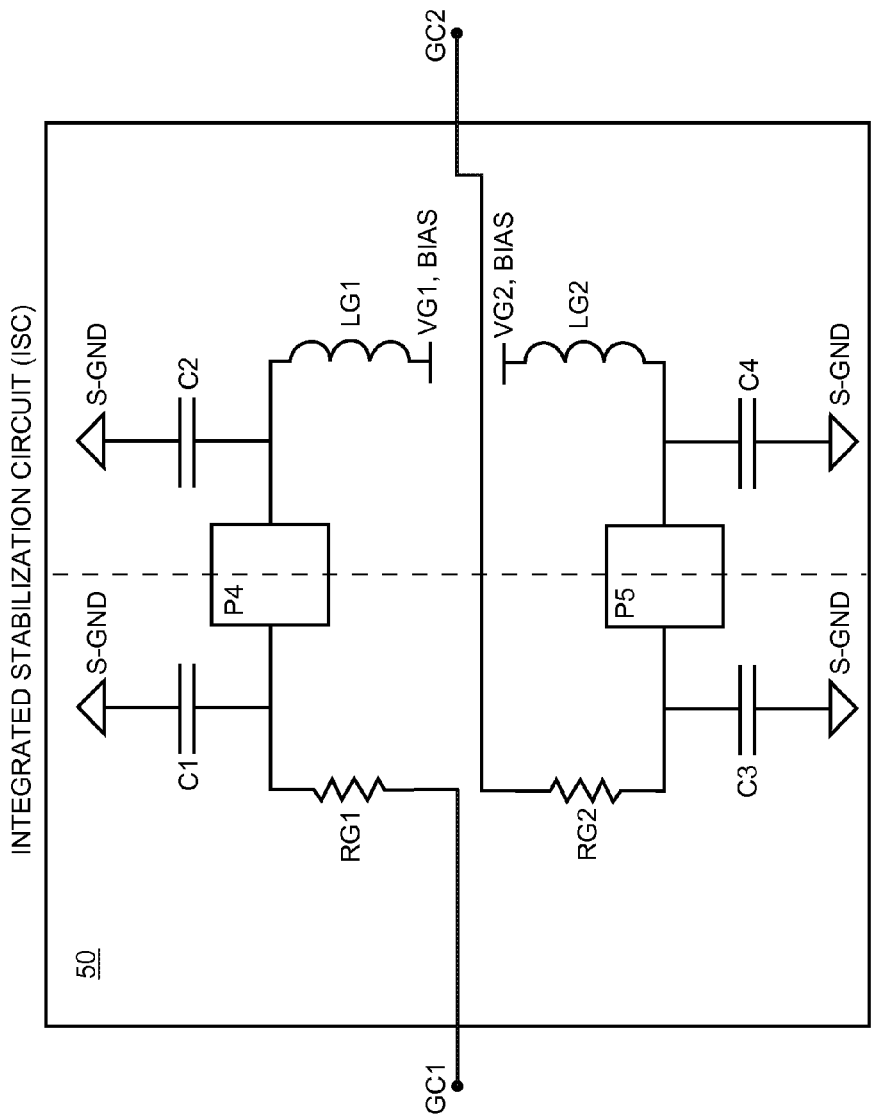
FIG. 4 is a simplified schematic that discloses details of the ISC included in the simplified schematic of FIG. 3.

FIG. 4 is a simplified schematic that discloses details of the ISC 50 included in the simplified schematic of FIG. 3. In an exemplary embodiment, the ISC 50 includes a first gate resistor RG1 coupled between the first gate control output GC1 and a node that in this exemplary case is a fourth bond pad P4. A first filter capacitor C1 is coupled between the fourth bond pad P4 and signal ground. (S-GND). A second filter capacitor C2 is coupled between the fourth bond pad P4 and S-GND and a first inductor LG1 is coupled between a first gate bias voltage source VG1 and the fourth bond pad P4.

The ISC 50 also has a second gate resistor RG2 coupled between the second gate control output GC2 and a node, which in this exemplary case is a fifth bond pad P5. A third filter capacitor C3 is coupled between the fifth bond pad P5 and S-GND. A fourth filter capacitor C4 is coupled between the fifth bond pad P5 and S-GND, and a second inductor LG2 is coupled between a second gate bias voltage source VG2 and the fifth bond pad P5. A dashed line bisecting the schematic of the ISC 50 defines an optional internal component region to the left of the dashed line and an optional external component region to the right of the dashed line. As illustrated, the first filter capacitor C1, the third filter capacitor C3, the first gate resistor RG1 and the second gate resistor RG2 are internal components, while the second filter capacitor C2, the fourth filter capacitor C4, the first inductor LG1 and the second inductor LG2 are external components. However, it is to be understood that the components listed as external components can be integrated with the components listed as integrated components in other embodiments. Moreover, in yet other embodiments, the components coupled to the fourth bond pad P4 can be integrated with the first dual gate field effect transistor DGFET1 on the first cascode amplifier die 44, while the components coupled to the fifth bond pad P5 can be integrated with the second dual gate field effect transistor DGFET2 on the second cascode amplifier die 46. Further still, it is to be understood that the network topology shown in FIG. 4 is exemplary and that the ISC 50 may include other network topology combinations of electrical components made up of pluralities of resistors, capacitors, and inductors.

The linearity of a wide bandwidth radio frequency amplifier such as the wide bandwidth radio frequency amplifier 42 is dependent on gate to drain capacitance Cgd of each of the first dual gate field effect transistor DGFET1 and the second dual gate field effect transistor DGFET2. A single gate field effect transistor such as the first field effect transistor FET1 (FIG. 1) has a parasitic access resistance that increases at higher temperature due to lowered electron mobility at the higher temperature. As such, there is a reduced voltage drop across an intrinsic gate to drain diode which in turn leads to an increase in gate to drain capacitance Cgd and a change in dependence on gate to drain voltage Vgd for the gate to drain capacitance Cgd. As a result, linearity degrades significantly for single gate field effect transistors operated at higher temperature. Fortunately, the first dual gate field effect transistor DGFET1 and the second dual gate field effect transistor DGFET 2 have gate to drain capacitances Cgd that are less sensitive to a reverse voltage across a depletion region of each gate diode and thus is less sensitive to temperature increases.

In terms of y-parameters, the gate to drain capacitance Cgd is represented by a y12 parameter. The magnitude of the y12 parameter of either the first dual gate field effect transistor DGFET1 or the second dual gate field effect transistor DGFET2 is significantly lower than the y12 parameter of any of the first field effect transistor FET1, the second field effect transistor FET2, the third field effect transistor FET3, or the fourth field effect transistor FET4 of the related art wide bandwidth radio frequency amplifier 10 (FIG. 1). Thus, the Cgd of the first dual gate field effect transistor DGFET1 or the second dual gate field effect transistor DGFET2 is significantly lower than the Cgd of the related art wide bandwidth radio frequency amplifier 10. Due to the significantly lower gate to drain capacitance Cgd, the linearity of the wide bandwidth radio frequency amplifier 42 is significantly greater than the linearity of the related art wide bandwidth radio frequency amplifier 10 regardless of the technology used.

Figure 5:
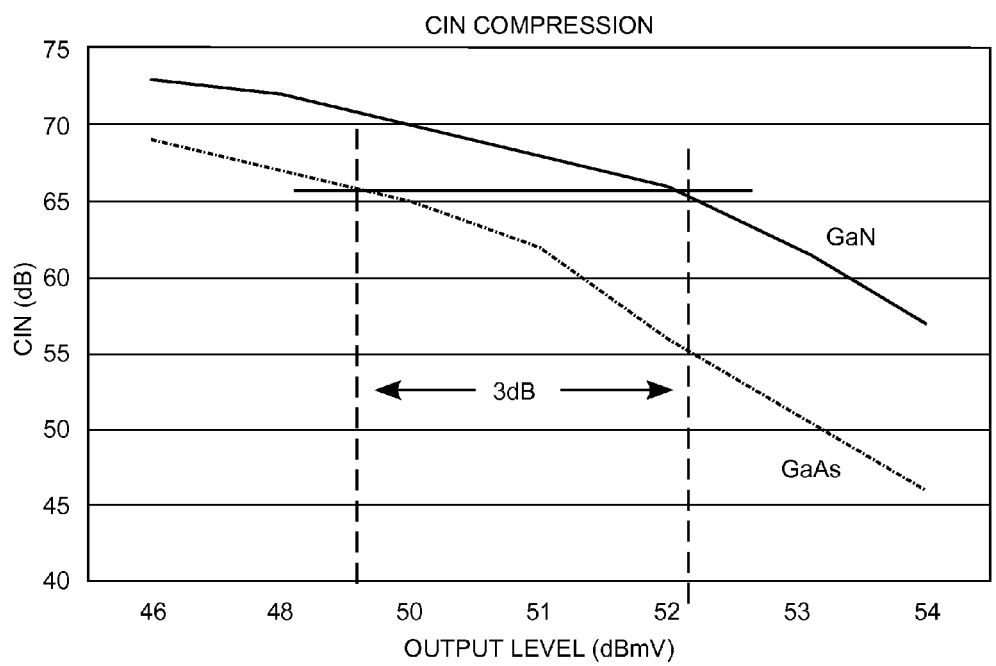
FIG. 5 is a graph of composite intermodulation noise (CIN) versus output level comparing gallium arsenide (GaAs) technology with gallium nitride (GaN) technology.

FIG. 5 is a graph of CIN versus output level comparing GaAs technology with GaN technology. The test conditions used to generate the graph of FIG. 5 included an initial voltage Vo=56.4 dBmV at 1003 MHz, 13.4 dB extrapolated tilt, 79 analog channels plus 75 digital channels using a −6 dB offset. The result of the test shown in the graph of FIG. 5 indicates that a GaN amplifier delivers at least 3 dB higher output power than GaAs for an equivalent linearity. It is to be understood that the wide bandwidth radio frequency amplifiers of the present disclosure may be extended to include multi-gate field effect transistors single die that have more than two gates per transistor. However, dual gate transistors are preferred for the wide bandwidth radio frequency amplifiers of the present disclosure due to their simpler implementation.

Figure 6:
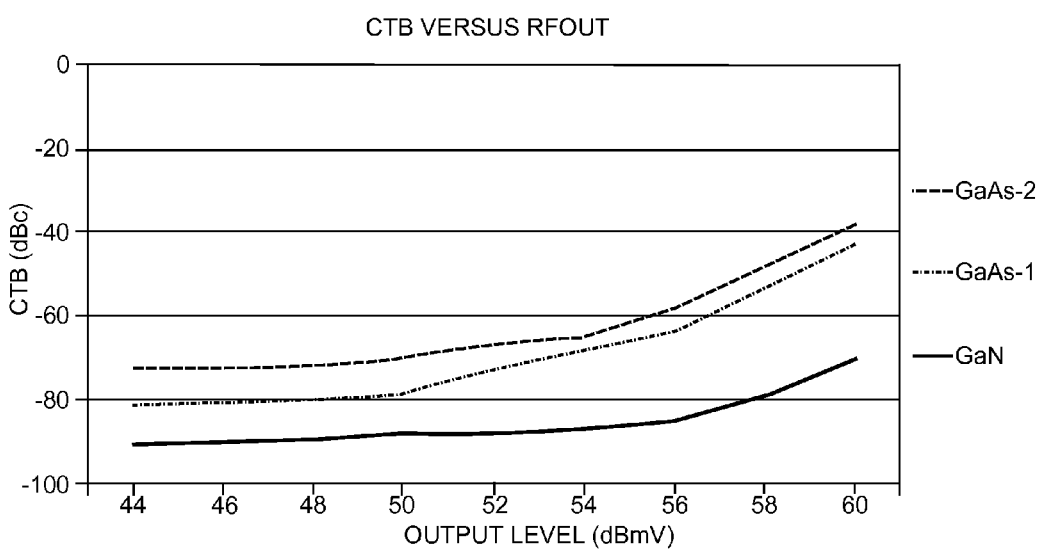
FIG. 6 is a graph of composite triple beat (CTB) versus output level comparing GaAs technology with GaN technology.

FIG. 6 is a graph of CTB versus output level comparing GaAs technology with GaN technology. The test conditions used to generate the graph of FIG. 6 amplified a mixed signal waveform having frequency components from 54 MHz to 1002 MHz. The graph of FIG. 6 shows that a GaN based wide bandwidth radio frequency amplifier has significantly better CTB performance in comparison with either a first GaAs based wide bandwidth radio frequency amplifier GaAs-1 or a second GaAs based wide bandwidth radio frequency amplifier GaAs-2.

Figure 7:
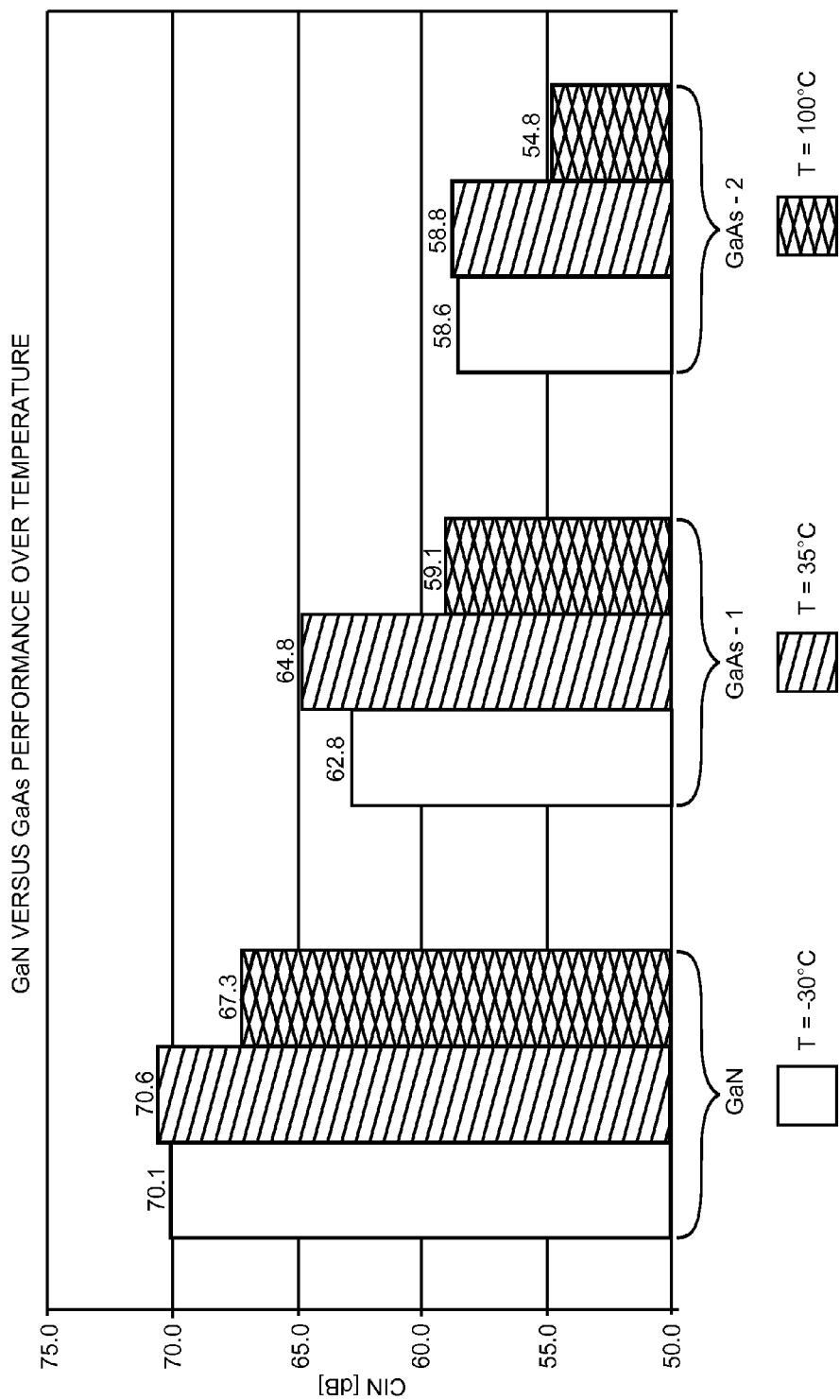
FIG. 7 is a graph of GaN versus GaAs performance over temperature.

FIG. 7 is a graph of GaN versus GaAs performance over temperature. In particular, the graph of FIG. 7 demonstrates that GaN based wide bandwidth radio frequency amplifiers provide twice an amount of RF power (6 dBm) with an order of magnitude (10 dB) decrease in CIN over a temperature range from around about −30° C. to around about 100° C. without increasing dissipated power when compared to either the first GaAs based wide bandwidth radio frequency amplifier GaAs-1 or the second GaAs based wide bandwidth radio frequency amplifier GaAs-2.

Figure 8:
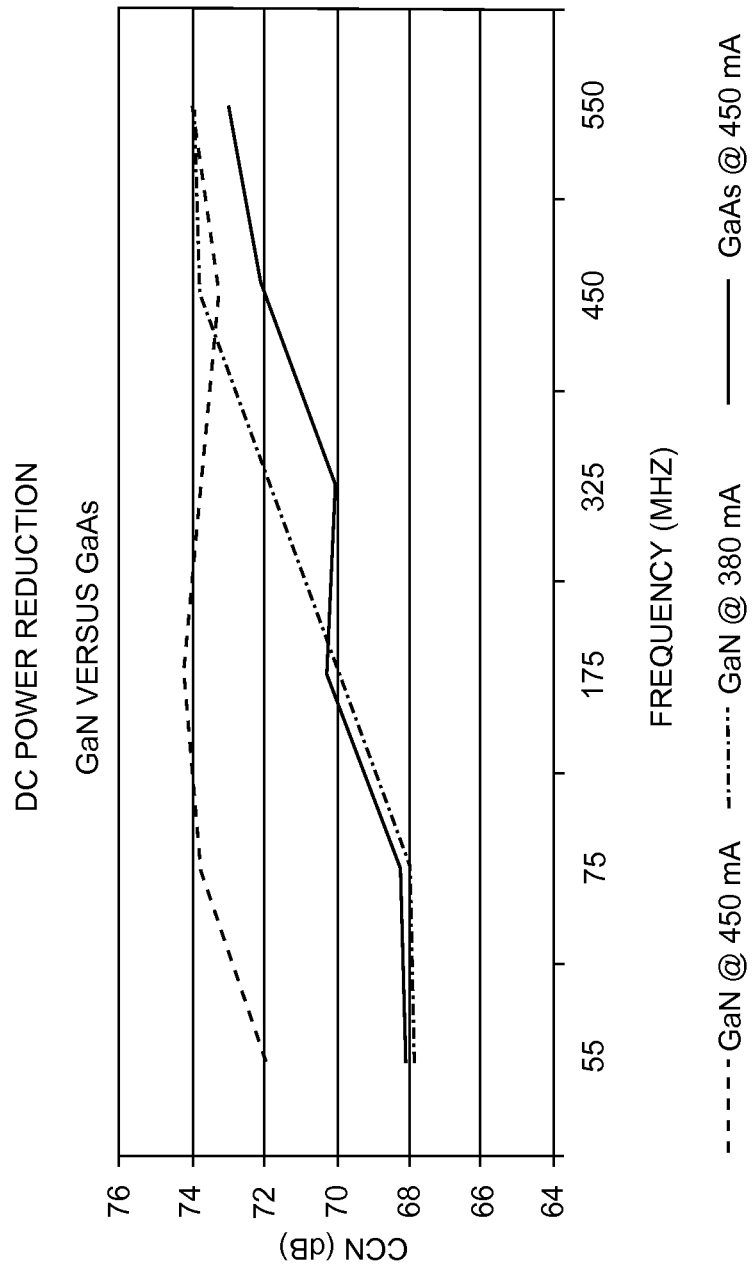
FIG. 8 is a graph of GaN versus GaAs for direct current (DC) power reduction.

FIG. 8 is a graph of GaN versus GaAs for direct current (DC) power reduction. As shown in the graph of FIG. 8, a GaN based wide bandwidth radio frequency amplifier consumes around about 20% less current than a GaAs based wide bandwidth radio frequency amplifier for a given linearity.

Figure 9:
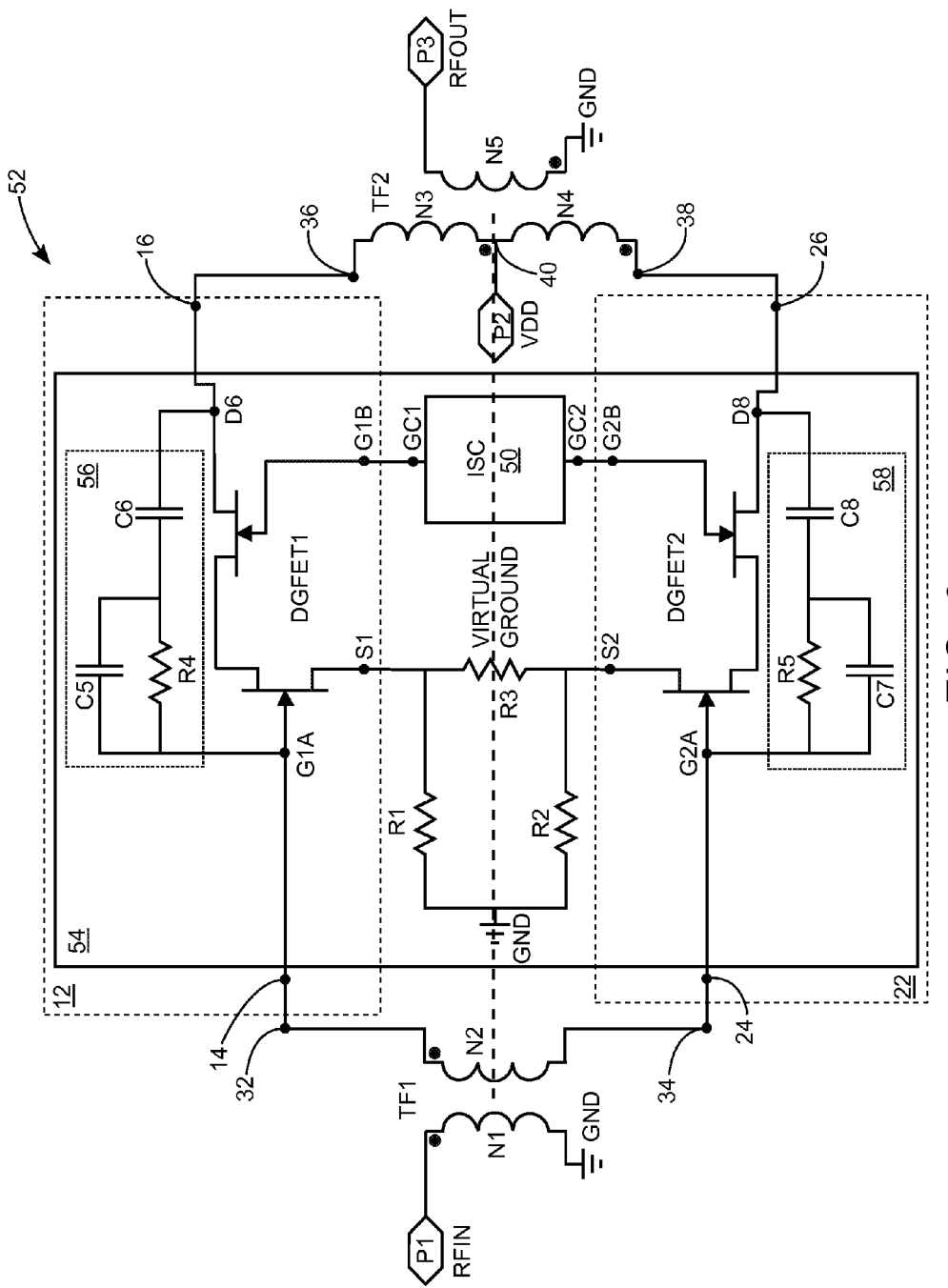
FIG. 9 is a simplified schematic of a wide bandwidth radio frequency amplifier that in accordance with the present disclosure is fabricated on a single die that includes feedback circuitry for the wide bandwidth radio frequency amplifier.

FIG. 9 is a simplified schematic of a wide bandwidth radio frequency amplifier 52 that in accordance with the present disclosure is fabricated on a single die 54 that includes feedback circuitry for the wide bandwidth radio frequency amplifier 52. The feedback circuitry includes a first feedback network 56 coupled between the first gate G1A and the first drain D6 of the first dual gate field effect transistor DGFET1. An exemplary embodiment of the first feedback network 56 includes a resistor R4 and a capacitor C5 that are coupled in parallel and in series with a capacitor C6. The feedback circuitry also includes a second feedback network 58 coupled between the second gate G2A and the second drain D8 of the second dual gate field effect transistor DGFET2. An exemplary embodiment of the second feedback network 58 includes a resistor R5 and a capacitor C7 that are coupled in parallel and in series with a capacitor C8. A benefit of incorporating the first feedback network 56 and the second feedback network 58 is that doing so allows for control of the overall gain bandwidth and stability of the wide bandwidth radio frequency amplifier 52. It is to be understood that other embodiments of the first feedback network 56 and the second feedback network 58 may include other network topology combinations of electrical components made up of pluralities of resistors, capacitors, and inductors.

The benefit of fabricating the wide bandwidth radio frequency amplifier 52 on the single die 54 is an increase in linearity, a minimum number of bond wires, and a simpler manufacturing process. One reason for an increase in linearity is that the first dual gate field effect transistor DGFET1 and the second dual gate field effect transistor DGFET2 are located close to each other on the single die 54. As a result of being located on the single die 54, a best match in physical and electrical characteristics between the first dual gate field effect transistor DGFET1 and the second dual gate field effect transistor DGFET2 can be realized. Moreover, locating the first dual gate field effect transistor DGFET 1 and the second dual gate field effect transistor DGFET 2 on the same die minimizes parasitic inductances and capacitances due to bond wires.

Those skilled in the art will recognize improvements and modifications to the embodiments of the present disclosure. All such improvements and modifications are considered within the scope of the concepts disclosed herein and the claims that follow.

What is claimed is:
1. A wide bandwidth radio frequency amplifier comprising:
 a first signal path having a first input and a first output;
 a first dual gate field effect transistor having a first-first gate coupled to the first input, a first drain coupled to the first output, and a first-second gate;

a second signal path having a second input and a second output; and a second dual gate field effect transistor having a second-first gate coupled to the second input, a second drain coupled to the second output, and a second-second gate, wherein the first-first gate and the second-first gate are coupled through at least one resistor.

2. The wide bandwidth radio frequency amplifier of claim 1 further comprising:

an unbalanced-to-balanced transformer having a radio frequency input, a first phase output coupled to the first input of the first signal path, and a second phase output coupled to the second input of the second signal path; and a balanced-to-unbalanced transformer having a first phase input coupled to the first output of the first signal path, a second phase input coupled to the second output of the second signal path, and a radio frequency output.

3. The wide bandwidth radio frequency amplifier of claim 1 wherein the first dual gate field effect transistor is fabricated on a single die.

4. The wide bandwidth radio frequency amplifier of claim 2 wherein the first dual gate field effect transistor is in a cascode configuration.

5. The wide bandwidth radio frequency amplifier of claim 1 wherein the first dual gate field effect transistor is a gallium nitride (GaN) field effect transistor.

6. The wide bandwidth radio frequency amplifier of claim 1 wherein the second dual gate field effect transistor is fabricated on a single die.

7. The wide bandwidth radio frequency amplifier of claim 6 wherein the second dual gate field effect transistor is in a cascode configuration.

8. The wide bandwidth radio frequency amplifier of claim 1 wherein the second dual gate field effect transistor is a gallium nitride (GaN) field effect transistor.

9. The wide bandwidth radio frequency amplifier of claim 1 further including an integrated stabilization circuit (ISC) having a first gate control output coupled to the first-second gate of the first dual gate field effect transistor and a second gate control output coupled to the second-second gate of the second dual gate field effect transistor.

10. The wide bandwidth radio frequency amplifier of claim 9 wherein the ISC comprises:

a first gate resistor coupled between the first gate control output and a first node;

a first filter capacitor coupled between the first node and a signal ground;

a second filter capacitor coupled between the first node and the signal ground; and a first inductor coupled between a first gate bias voltage source and the first node.

11. The wide bandwidth radio frequency amplifier of claim 10 wherein the first gate resistor and the first filter capacitor are integrated with the first dual gate field effect transistor on a single die.

12. The wide bandwidth radio frequency amplifier of claim 11 wherein the first gate resistor and the first inductor are externally coupled to the single die.

13. The wide bandwidth radio frequency amplifier of claim 10 wherein the ISC further comprises:

a second gate resistor coupled between the second gate control output and a second node;

a third filter capacitor coupled between the second node and the signal ground;

a fourth filter capacitor coupled between the second node and the signal ground; and a second inductor coupled between a second gate bias voltage source and the first node.

14. The wide bandwidth radio frequency amplifier of claim 13 wherein the second gate resistor and second filter capacitor are integrated with the second dual gate field effect transistor on a single die.

15. The wide bandwidth radio frequency amplifier of claim 14 wherein the second gate resistor and the second inductor are externally coupled to the single die.

16. The wide bandwidth radio frequency amplifier of claim 1 wherein the first dual gate field effect transistor and the second dual gate field effect transistor deliver at least 3 dB higher output power than a GaAs based wide bandwidth radio frequency amplifier for an equivalent linearity.

17. The wide bandwidth radio frequency amplifier of claim 1 wherein the first dual gate field effect transistor and the second dual gate field effect transistor deliver at least 6 dBmV higher output power than a GaAs based wide bandwidth radio frequency amplifier while providing at least a 10 dB decrease in composite intermodulation noise (CIN) over a temperature range that extends from around about −30° C. to around about 100° C.

18. The wide bandwidth radio frequency amplifier of claim 17 wherein the 6 dBmV higher output power and the 10 dB decrease in CIN over a GaAs based wide bandwidth radio frequency amplifier without increasing dissipated power from the first dual gate field effect transistor and the second dual gate field effect transistor.

19. The wide bandwidth radio frequency amplifier of claim 1 wherein linearity is significantly less dependent on gate to drain capacitance Cgd of each of the first dual gate field effect transistor and the second dual gate field effect transistor over a temperature range that extends from around about −30° C. to around about 100° C. than a GaAs based wide bandwidth radio frequency amplifier for an equivalent linearity.

20. The wide bandwidth radio frequency amplifier of claim 1 wherein the first dual gate field effect transistor and the second dual gate field effect transistor consume around about 20% less current than a GaAs based wide bandwidth radio frequency amplifier for a given linearity.

21. A wide bandwidth radio frequency amplifier comprising:

a first signal path having a first input and a first output;

a first dual gate field effect transistor having a first-first gate coupled to the first input, a first drain coupled to the first output, and a first-second gate;

a second signal path having a second input and a second output; and a second dual gate field effect transistor having a second-first gate coupled to the second input, a second drain coupled to the second output, and a second-second gate, wherein the first dual gate field effect transistor and the second dual gate field effect transistor are integrated onto a single die, such that the first-first gate and the second-first gate are coupled through at least one resistor.

22. The wide bandwidth radio frequency amplifier of claim 21 further including a first feedback network coupled between the first-first gate and the first drain of the first dual gate field effect transistor, and a second feedback network coupled between the second-first gate and the second drain of the second dual gate field effect transistor.

* * * * *